United States Patent [19]

Clemons et al.

[11] Patent Number: 4,590,388
[45] Date of Patent: May 20, 1986

[54] CMOS SPARE DECODER CIRCUIT

[75] Inventors: Donald G. Clemons, Northampton; Michael V. DePaolis, Jr., Center Valley, both of Pa.

[73] Assignee: AT&T Bell Laboratories, Murray Hill, N.J.

[21] Appl. No.: 602,680

[22] Filed: Apr. 23, 1984

[51] Int. Cl.$^4$ .................. H03K 19/096; H03K 19/20; H03K 19/003; G11C 7/00
[52] U.S. Cl. .................. 307/202.1; 307/441; 307/449; 307/469; 365/200
[58] Field of Search .................. 307/202.1, 219, 441, 307/449, 463, 468, 469; 365/96, 200; 340/825.83, 825.84

[56] References Cited

U.S. PATENT DOCUMENTS

| | | | |
|---|---|---|---|
| 3,911,289 | 10/1975 | Takemoto | 307/205 |
| 4,228,528 | 10/1980 | Cenker et al. | 365/200 |
| 4,358,833 | 11/1982 | Folmsbee et al. | 365/200 |
| 4,365,319 | 12/1982 | Takemae | 365/200 |
| 4,399,372 | 8/1983 | Tanimoto et al. | 307/449 X |
| 4,494,220 | 1/1985 | Dumbri et al. | 365/200 |
| 4,495,427 | 1/1985 | Cartwright, Jr. | 307/469 |

OTHER PUBLICATIONS

Abbott et al., "Equipping a Line of Memories with Spare Cells", pp. 127–130; *Electronics*, 7/28/1981.

*Primary Examiner*—Larry N. Anagnos
*Attorney, Agent, or Firm*—James H. Fox

[57] ABSTRACT

A spare decoder provides for the substitution of a spare component for repair of a defective semiconductor chip. For example, a spare row or column of memory cells can be substituted for a defective row or column of a memory chip by fusing fusible links in the decoder. The present invention implements the decoder in CMOS technology. To minimize power consumption, means are included for preventing current flow in an unused spare without having to fuse a link.

10 Claims, 5 Drawing Figures

Ⓧ = FUSIBLE LINK

CMOS SPARE DECODER CIRCUIT

BACKGROUND OF THE INVENTION

1. Field of the Invention

The present invention relates to a circuit implemented in complementary metal oxide semiconductor (CMOS) technology for providing a spare decoder circuit for random access memories and other semiconductor devices.

2. Description of the Prior Art

The use of spare components to replace defective components on semiconductor integrated circuit chips, generally referred to as "redundancy", has become increasingly utilized in recent years. The yield of good chips from a given wafer is strongly influenced by the size and number of defects that occur on the wafer. Such defects include defects in the silicon semiconductor crystal material that forms the substrate, as well as defects in oxide layers and conductors. Defects have become increasingly significant as the size of the individual components (that is the transistors, conductors, storage capacitors, resistors, and other components) becomes smaller relative to the size of the defects, and also as the overall area of the chip increases; both effects tend to increase the severity of the defect problem.

Fortunately, techniques have been developed to isolate defective portions of a circuit and substitute spare portions that have been included for that purpose. In particular, for the repair of memory chips wherein the memory cells are arranged in an array of rows and columns, techniques have been developed to substitute spare rows and columns; see for example, U.S. Pat. No. 4,228,528 co-assigned with the present invention. In that technique, fusible links are included to disconnect a defective row or column of memory cells, and means are provided for encoding the address of the disconnected portion into a spare row or column decoder, wherein the operation of the memory as viewed by an external user is substantially unaltered by the repair. The success of this technique in dealing with the defect problem has led to its incorporation in a large number of memories at the 64 kilobit level, and even a larger proportion at the 256 kilobit and 1 megabit levels.

To date, the incorporation of redundant rows and columns has been accomplished mainly in dynamic random access memories (DRAMs). Such memories typically utilize dynamic address decoders, so that relatively little average power is drawn during decoder operation, and virtually no power is drawn by the decoder during standby conditions. A typical programmable dynamic decoder is shown in FIG. 1. The fusible links are blown to encode the desired address into the decoder, so that a unique combination of the true and complement address lines produces a change in the voltage level at node 15. Redundant circuits have also been included in static type memories employing n-channel MOS (NMOS) technology, with a typical NMOS spare decoded circuit being shown in FIG. 2. The circuit includes a parallel string of NMOS transistors (T204-T209) to which true and complement address lines are connected. To program the decoder, one fusible link in each transistor pair (e.g., T204, T205 form a pair) is blown to disconnect the associated transistor. For example, in a decoder comprising two address line pairs (i.e., n=2) to encode the address $\overline{A1}$ A2, the fusible links in the drain paths of T204 and T207 are blown. When address lines $\overline{A1}$ and A2 are both in a low voltage state, node 21 goes to a high voltage state, due to conduction from positive voltage $V_{cc}$ through pull-up depletion type transistor T201. Any other address combination causes node 21 to be pulled to a low voltage state through T205 or T206. Transistors T202 and T203 provide that the decoder is able to respond to an address state only when the chip enable (CE) signal is high (and $\overline{CE}$ is low); otherwise, node 21 is pulled low through T203.

However, complementary metal oxide semiconductor (CMOS) technology is increasingly being used in memory (and other) circuits. A typical CMOS decoder circuit takes the form of a "tree decoder", wherein parallel p-channel MOS (PMOS) devices establish a high voltage state at the decoder output, and series NMOS devices are utilized to establish the low voltage level at the decoder output when the appropriate address is present.

To be suitable, a CMOS spare decoder circuit should not only be programmable, but also draw a minimum amount of current. In particular, CMOS devices have the potential for achieving very low standby current drains, since one transistor in a complementary pair can be off under static conditions. Hence, a spare decoder should preserve the very low standby current drain. Furthermore, it is desired that no link fusing be required if a spare decoder is not utilized to repair the chip.

SUMMARY OF THE INVENTION

We have invented a spare decoder circuit suitable for providing redundancy in integrated circuits. In the inventive circuit, 2n logic control signals are applied to the gates of a series string of n pairs of transistors having a channel conductivity of a first type. Fusible means are included to change the transistors between an operative condition and a non-operative condition, so as to allow programming the decoder to respond to one of $2^n$ logic states, typically representing a memory address. A disconnect circuit provides for disconnecting the spare decoder when it is not to be utilized on a given chip, or when the chip is not enabled. The disconnect circuit is arranged so as to not allow the current to flow in the spare decoder until an additional fusible means is fused. Current limiting means, typically comprising an MOS transistor, are included to limit current flow in the additional fusible means when in the conducting state when the chip is enabled.

DETAILED DESCRIPTION

Figure 3:
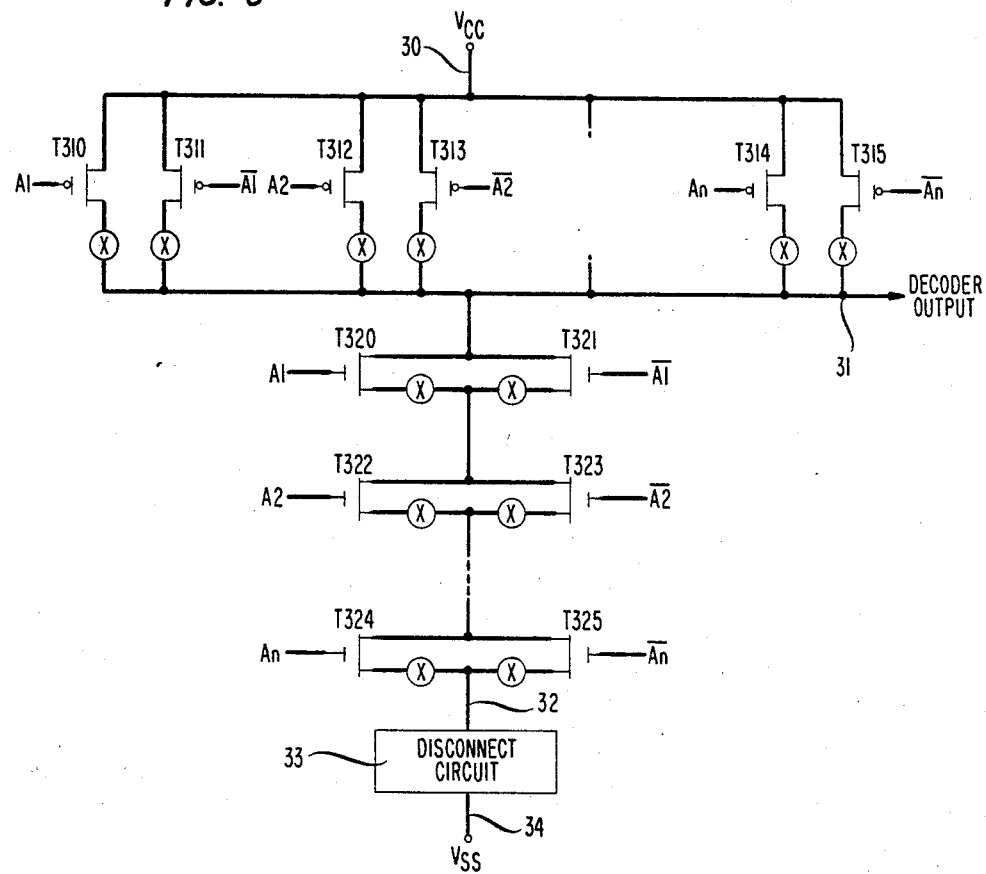
FIG. 3 one embodiment of the present inventive CMOS spare decoder circuit.

The following detailed description relates to a technique for obtaining a spare decoder circuit in CMOS technology. Referring to FIG. 3, in a typical embodiment, a parallel string of PMOS field effect transistor pairs (T310 through T315) have their sources connected to a common node 30, to which is supplied a source of positive potential. The drains of these transistors are coupled to a common node 31, which is the output of the decoder. As indicated, located between the drain of each PMOS transistor and node 31 is a "fusible link", discussed further below. The fusible link is "unfused" as fabricated, and can change conductivity state by the application of energy thereto; the link is then considered "fused". For present explanatory purposes, the fusible link is conductive as the circuit is fabricated, and is "blown" (i.e., "rendered non-conductive") to encode the circuit, typically by applying laser energy.

Connected between the decoder output node 31 and the "disconnect node" 32, is a series string of NMOS field effect transistor pairs. The drains of the transistors in a given pair are connected together at a drain node. The sources of the transistors in a given pair are also coupled together through the fusible links, as indicated, at a source node. The source node of an upper pair is connected to the drain node of a lower pair, as indicated. A "disconnect circuit" 33 is connected between the disconnect node 32 and a source of relative negative potential, typically a ground, at node 34.

Figure 1:
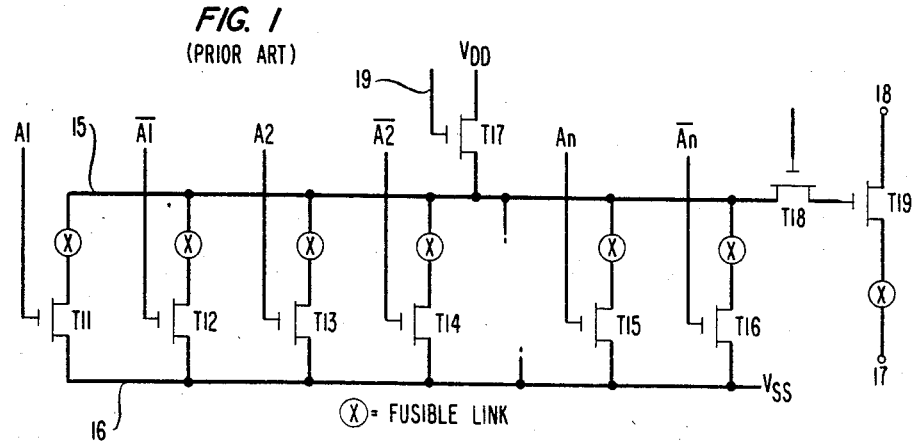
FIG. 1 shows a prior art spare decoder circuit for use in a dynamic random access memory.
Figure 2:
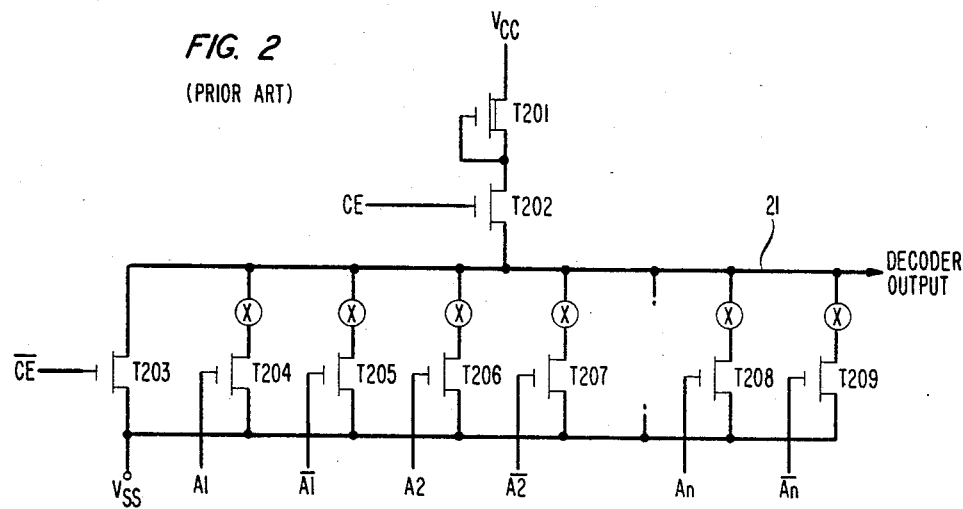
FIG. 2 shows a prior art NMOS static decoder.

The spare decoder circuit communicates with 2n address lines, including n true address lines (A1 through An), and n complement address lines (e,ovs/A1/ through $\overline{An}$). Each address line (e.g., A1) communicates with the gate of one transistor in a parallel pair (e.g., T310) and one transistor in a series pair (e.g., T320); the complement address line (e g. $\overline{A1}$) communicates with the gate of the other transistor in each pair (e.g., T311, T321). To program the decoder so that a decoded output is obtained when a given address state is present, the appropriate fusible links are blown, one in each pair. Upon programming, the decoder output is in a low voltage state (i.e., a logical zero), for only one of the $2^n$ address combinations. For example, in order to implement the logic $\overline{A1}A2$, discussed above for FIG. 2, the fusible links in the sources of transistors T310, T313, T320, and T323 are blown, effectively removing these transistors from the circuit. Then the decoder output is high except when the address $\overline{A1}A2$ is present, in which case the decoder output goes low. Hence, programming the spare decoder by blowing the appropriate fusible links, makes the decoder respond to any one of the $2^n$ address combinations. Thus, by using the above noted redundancy techniques, the decoder allows substitution of a spare row or column or other circuit for a defective one at a desired address.

The foregoing description has assumed that node 32 has been connected to a source of relative negative potential through the disconnect circuit. However, if node 32 is permanently connected to node 34, the tree decoder undesirably draws current from node 30 through node 34, since there will always be a continuous path through the various transistors until the circuit is programmed, regardless of the memory address applied thereto. In order to avoid this current drain, the disconnect circuit of the present technique substantially prevents current from flowing between nodes 32 and 34 when at least one of the following conditions is present: (1) prior to programming the decoder by blowing fusible links to encode the desired address; or (2) when the chip is not enabled, that is, not capable of responding to an address signal applied thereto. Furthermore, current limiting means are included to limit current flow in the disconnect circuit itself, as explained further below.

Figure 4:
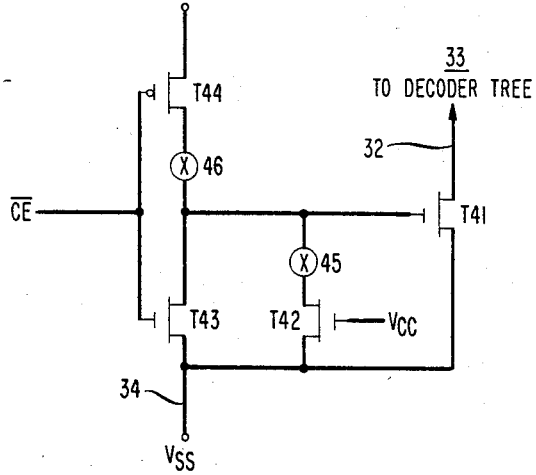

Referring to FIG. 4, in a first embodiment of the disconnect circuit, transistor T41 serves to control the flow of current from disconnect node 32 on the decoder tree to the relative negative supply voltage at node 34. Prior to programming the decoder, fusible link 45 connects the gate of T41 to the drain of T42, which transistor is conductive due to the $V_{cc}$ signal applied to its gate. When $\overline{CE}$ is high, i.e., when the chip is not enabled, PMOS transistor T44 is off, and the gate of NMOS transistor T41 is placed substantially at the $V_{ss}$ potential, and hence is cut off. Furthermore, the conductivity ratio between T44 and T42 is selected such that when $\overline{CE}$ is low, i.e., when the chip is enabled and thus T44 on, the voltage at the gate of T41 is below $V_T$, the turn-on threshold voltage. Therefore, substantially no current flows between nodes 32 and nodes 34 and the decoder is not enabled. The present technique hence provides that if the spare decoder is not needed to repair a given chip, it is not necessary for a fusible link to be blown. When fusible link 45 is unblown (i.e., conducting), a current path exists between $V_{cc}$ and $V_{ss}$ through transistors T44 and T42 when $\overline{CE}$ is low. To minimize this current, either transistor T42 or T44 is chosen to be a relatively low gain device, to act as a current limiter. However, T44 should have enough gain to allow rapid enabling of the decoder tree when $\overline{CE}$ changes from a high to low state. To minimize current while obtaining the desired speed, a PMOS transistor having a channel width of 10 micrometers and a channel length of 1.5 micrometers is typically suitable for T44.

If it is desired to utilize the spare decoder, then the fusible link 45 is blown. This allows the decoder to be controlled by a chip enable complement ($\overline{CE}$) signal that is applied to the gates of transistors T43 and T44. When the $\overline{CE}$ signal is in a low voltage state, i.e., when the chip is enabled, transistor T44 conducts, and a high voltage is present on the gate of transistor T41. This allows current to flow between nodes 32 and 34, thus enabling the decoder. However, when the $\overline{CE}$ signal goes to a high voltage state, i.e., when the chip is disabled, the gate of transistor T41 is pulled down to substantially the $V_{ss}$ potential through transistor T43. Hence, transistor T41 is cut off, and the decoder tree is not enabled. In this manner, power dissipation in the spare decoder tree is minimized when the chip is not enabled. It is possible to still further minimize power consumption in case the spare decoder is not to be utilized in repairing the chip. In that case, fusible link 46 can be blown, thus eliminating the current that would otherwise flow from $V_{cc}$ to $V_{ss}$ through transistors T44 and T42 when the $\overline{CE}$ signal is low; i.e., when the chip is enabled.

Figure 5:
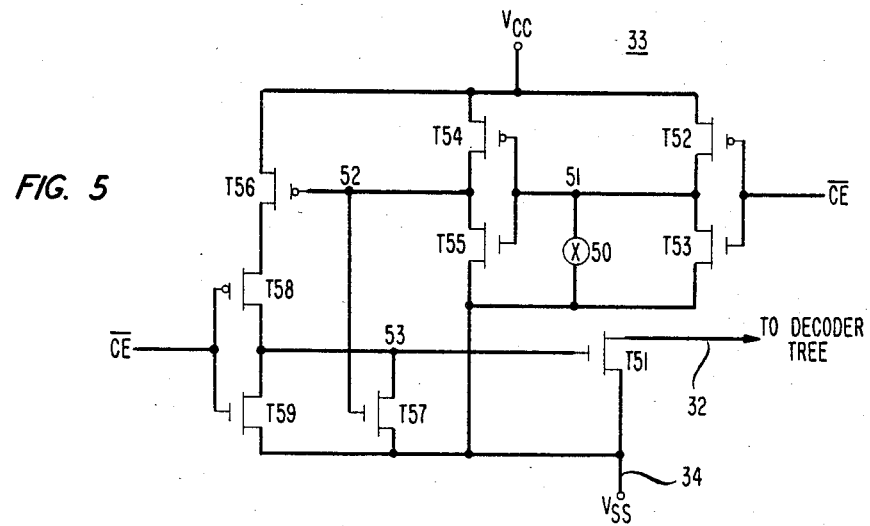
FIGS. 4 and 5 show embodiments of the disconnect circuit used in the present invention.

A second embodiment of the disconnect circuit is shown in FIG. 5. Here, transistor T51 controls the current flowing from disconnect node 32 to $V_{ss}$ at node 34. The conduction of transistor T51 is in turn controlled by complimentary pairs T58, T59; T56, T57; T54, T55; and T52, T53, in the following manner: When fusible link 50 is conductive, node 51 is connected to $V_{ss}$, and hence node 52 is in a high voltage state due to T54 being conductive and T55 being nonconductive. This in turn holds node 53 at a low voltage state due to T56 being nonconducting and T57 being conductive. Hence, the gate of T51 is held low, thereby not allowing current flow through the decoder tree, regardless of the state of the $\overline{CE}$ signal at the gates of transistors T52, T53, T58, and T59. When it is desired to utilize the spare decoder, fusible link 50 is blown, which allows the circuit 33 to then respond to the $\overline{CE}$ signal. When $\overline{CE}$ is high, i.e., the chip is not enabled, it is apparent that node 53 is in a low voltage state, thus turning off transistor T51 due to the conduction of both transistors T59 and T57. However, when $\overline{CE}$ is in a low voltage state and the chip enabled, node 53 is placed at a high voltage state due to conduction of T58 and T56, so that transistor T51 enables the decoder tree by allowing current flow there through.

By isolating the fusible link 50 from the gate of T51 by one or more complementary pairs (e.g., T54, T55; T56, T57) it is possible to further reduce the current consumption of the disconnect circuit as compared to the circuit of FIG. 4, when the decoder is not to be utilized (i.e., link 50 is unblown and hence conductive). This is because when the chip is enabled ($\overline{CE}$ low) the only current path from $V_{cc}$ to $V_{ss}$ (through link 50) is through T52, which can be made relatively low-gain. For example, a channel length of approximately 4 micrometers and a channel width of approximately 1.5 micrometers for transistor T52 provides a disconnect circuit current consumption of about 20 microamps for an enabled (but not utilized) spare decoder. However, when the spare is to be utilized (link 50 blown) additional current gain is obtained for the chip enable signal from transistors T54-T59. Hence, node 53 can rapidly recover to a high voltage state when the chip is enabled ($\overline{CE}$ goes from high to low), allowing the tree decoder to be rapidly enabled. Thus, both low current consumption and rapid response are accommodated by the circuit of FIG. 5.

It is apparent that still other techniques can be utilized to change the decoder transistors between an operative and a nonoperative condition. For example, while the fusible links have been described herein as being normally conductive as fabricated, and being rendered nonconductive by laser radiation, it is also known in the art to produce a fusible link that is normally substantially nonconductive as fabricated, being rendered conductive by a pulse of laser or other type of energy. For this purpose, dopants can diffuse across a nonconducting region to render the fuse conducting; see for example, "A High-CMOS II 8K×8Bit Static RAM" by O. Minato et al, *IEEE Journal of Solid State Circuits*, Vol. SC-17, page 795 (1982). It is also known to change conductivity states by damaging a transistor structure with laser radiation; see for example, U.S. Pat. No. 4,387,503. Also, fusible links are known that are electrically alterable, as by application of a high current pulse to open the link, rather than by the use of laser radiation. Furthermore, the fusible links can be connected either to the drain paths of their respective transistors, or to the source paths.

The above description of the spare decoder circuit has been in terms of selecting rows or columns of a memory chip in response to address states. However, it is also possible to use the present technique for other types of integrated circuits. For example, the proposed wafer scale integration techniques rely on the ability to make circuits on a semiconductor wafer, and then connect the usable circuits in a desired pattern; see for example, "Wafer Scale Integration: The Limits VLSI?" by D. L. Peltzer, *VLSI Design* pages 43–47 (Sept. 1983). It is apparent that the present decoder can be encoded with the address location of a usable circuit, to provide for its connection to other circuits on the wafer, or to external connections, or to a power source. Furthermore, a programmable decoder of the present invention need not be a spare decoder in the sense of providing redundancy, but may be programmable for the purposes of customizing the design or operation of a circuit. Hence, the logic states applied to the gates of the decoder transistors herein need not correspond to address states in all cases. While the decoder tree of FIG. 3 utilizes parallel PMOS transistors and series NMOS transistors, it is apparent that these types can be reversed; that is, series PMOS transistors can be connected to parallel NMOS transistors, with the power supply potential appropriately changed. In that case, the decoder responds to the complement of the address for which the decoder of FIG. 3 responds; that is, the decoder output is in a high voltage state when all of the address inputs to the active transistors are in a low voltage state.

The present technique can advantageously be applied to other CMOS spare decoder circuits employing a programmable series string of transistor pairs. For example, "domino CMOS" logic provides for a series connection of transistors comparable to the programmed series string herein. A p-channel transistor then precharges the string, which is allowed to discharge only when an n-channel device is activated. This latter device can then correspond to the enabling transistor (T41, T51) of the present invention; see "High-Speed Compact Circuits With CMOS", R. H. Krambeck et al, *IEEE Journal of Solid-State Circuits*, Vol. SC-17, pp. 614–619 (1982). Alternately, the enabling transistor of the present invention can be placed in series with the n-channel discharge transistor of the domino logic gates; i.e., the decoder current flows through the channels of both transistors. Still other variations are possible. Although a domino CMOS circuit does not draw static current, the present technique advantageously provides for activating such a circuit, and eliminates dynamic current in an unused spare decoder. While the disconnect circuit in FIG. 3 is shown at the lower end of the decoder tree, connected to the negative supply, it is apparent that with appropriate circuit modifications it can be placed at other locations in the decoder tree. For example, the disconnect circuit can be placed between the top of the decoder tree and the positive voltage supply, in which case, the control transistors T41 in FIG. 4 and T51 in FIG. 5 can conveniently be p-channel devices, with other appropriate changes to the circuit. Finally, it is apparent that the decoder provides for a relative change in voltage levels at its output when an address is selected. However, the absolute level of that voltage can be adjusted as desired by the choice of the positive potential at node 30 and the negative potential at node 34. For example, node 30 can be at a ground potential and node 34 at a negative potential. In that case, a low voltage on the decoder output can be considered a logical "1", and the more positive voltage output a logical "0", as is typically the case when interfacing the decoder with p-channel logic devices or memory access transistors. It is apparent that the voltage levels on the gates should be changed accordingly. All such variations and deviations utilizing the present inventive teachings are within the spirit and scope of the present invention.

What is claimed is:

1. An integrated circuit comprising an array of field effect transistors capable of being programmed by fusing fusible means so that said array as programmed responds to a unique one of $2^n$ logic states,

CHARACTERIZED IN THAT said array comprises a series string of n pairs of field effect transistors having a channel of a first conductivity type, wherein said fusible means are capable of changing each of said transistors between an operative and a nonoperative condition, wherein said string is adapted to carry a decoder current that flows through the channels of the operative transistors therein; and further charactered by additional fusible means for preventing the flow of said current until said additional fusible means is fused; and still further characterized by enabling means to allow said decoder current to flow only when an enabling signal is in a given voltage state.

2. The integrated circuit of claim 1 wherein said array further comprises a parallel string of n pairs of field effect transistors having a channel of a second conductivity type opposite said first conductivity type, and wherein the channel currents flowing through the operative transistors in said parallel string are combined at a common node so as to produce said decoder current.

3. The integrated circuit of claim 1 wherein said additional fusible means is in the conducting state until the application of fusing energy thereto.

4. The integrated circuit of claim 1 wherein said additional fusible means is in the nonconducting state until the application of fusing energy thereto.

5. The integrated circuit of claim 1 wherein said additional fusible means is adapted to being changed between the conducting and the non-conducting state by the application of laser energy.

6. The integrated circuit of claim 1 wherein said additional means is adapted to being changed between the conducting and nonconducting state by the application of an electrical current.

7. The integrated circuit of claim 1 wherein said additional fusible means controls a voltage on the gate of a control transistor through which said decoder current flows.

8. The integrated circuit of claim 7 further comprising current limiting means to limit the current that flows through said additional fusible means when said enabling signal allows said decoder current to flow.

9. The integrated circuit of claim 7 wherein said additional fusible means controls the gate voltage of a complementary pair of field effect transistors, wherein said complementary pair controls the gate voltage of said control transistor.

10. The integrated circuit of claim 7 wherein said enabling signal controls the voltage on the gate of said control transistor when said additional fusible means is fused.

* * * * *